United States Patent
Kelch et al.

(10) Patent No.: US 12,210,335 B2
(45) Date of Patent: Jan. 28, 2025

(54) WORKCELL MODELING USING MOTION PROFILE MATCHING AND SWEPT PROFILE MATCHING

(71) Applicant: Intrinsic Innovation LLC, Mountain View, CA (US)

(72) Inventors: Timothy Robert Kelch, San Jose, CA (US); Dirk Holz, Mountain View, CA (US)

(73) Assignee: Intrinsic Innovation LLC, Mountain View, CA (US)

( * ) Notice: Subject to any disclaimer, the term of this patent is extended or adjusted under 35 U.S.C. 154(b) by 863 days.

(21) Appl. No.: 17/338,486

(22) Filed: Jun. 3, 2021

(65) Prior Publication Data
US 2022/0390922 A1   Dec. 8, 2022

(51) Int. Cl.
*G05B 19/414* (2006.01)
*G05B 19/21* (2006.01)
(Continued)

(52) U.S. Cl.
CPC .......... *G05B 19/414* (2013.01); *G05B 19/21* (2013.01); *G05B 19/4063* (2013.01);
(Continued)

(58) Field of Classification Search
CPC ...... G05B 19/414; G06N 20/00; G06F 30/20; G06F 30/17
See application file for complete search history.

(56) References Cited

U.S. PATENT DOCUMENTS 8,391,623 B2   3/2013  Nishi et al.
9,701,019 B2 *  7/2017  Eberst ................ B25J 9/1664
(Continued)

FOREIGN PATENT DOCUMENTS

JP   1999058277   3/1999
JP   2015160253   9/2015
KR   101363092   2/2014

OTHER PUBLICATIONS

Larsen, Christian, Including a Collaborative Robot in Digital Twin Manufacturing Systems, Mar. 2019, Department of Electrical Engineering Systems and Control, Chalmers University of Technology (Year: 2019).*

(Continued)

*Primary Examiner* — Iftekhar A Khan
(74) *Attorney, Agent, or Firm* — Fish & Richardson P.C.

(57) ABSTRACT

Methods, systems, and apparatus, including computer programs encoded on computer storage media, for measuring and reporting calibration accuracy of robots and sensors assigned to perform a task in an operating environment. One of the methods includes obtaining sensor data of one or more physical robots performing a process in an operating environment; generating, from the sensor data for a first robot of the one or more physical robots, a motion profile representing how the first robot moves while performing the process; obtaining data representing a plurality of candidate virtual robot components, each having a respective virtual motion profile and is a candidate to be included in a virtual representation of the operating environment; performing a motion profile matching process to determine a first virtual robot component from the plurality of candidate virtual robot components that matches the first robot; and adding the first virtual robot component to the virtual representation.

20 Claims, 4 Drawing Sheets

(51) Int. Cl.
  *G05B 19/4063* (2006.01)
  *G05B 19/4093* (2006.01)
  *G06F 30/17* (2020.01)
  *G06F 30/20* (2020.01)
  *G06N 5/04* (2023.01)
  *G06N 20/00* (2019.01)

(52) U.S. Cl.
  CPC ....... *G05B 19/40931* (2013.01); *G06F 30/17* (2020.01); *G06F 30/20* (2020.01); *G06N 5/04* (2013.01); *G06N 20/00* (2019.01)

(56) References Cited

U.S. PATENT DOCUMENTS

| | | | |
|---|---|---|---|
| 10,525,594 | B2 | 1/2020 | Ogata |
| 10,896,543 | B2 | 1/2021 | Kuffner |
| 10,967,506 | B2 | 4/2021 | Bradski et al. |
| 11,254,003 | B1* | 2/2022 | Zhao ................... G05D 1/0217 |
| 11,409,260 | B2* | 8/2022 | Linnell ................. G05B 19/42 |
| 2007/0168100 | A1* | 7/2007 | Danko .................. B25J 9/1628 701/50 |
| 2011/0035087 | A1* | 2/2011 | Kim ..................... G05D 1/0274 701/25 |
| 2013/0178980 | A1* | 7/2013 | Chemouny ............ B25J 9/1671 700/255 |
| 2014/0009561 | A1* | 1/2014 | Sutherland ............ B62D 11/04 348/14.05 |
| 2014/0063096 | A1* | 3/2014 | Pitz ...................... B41J 11/002 347/9 |
| 2015/0168940 | A1* | 6/2015 | Geweth ................. G05B 19/19 700/61 |
| 2016/0016311 | A1* | 1/2016 | Konolige ............... B25J 9/1664 901/30 |
| 2016/0046023 | A1* | 2/2016 | Nagendran ............ B25J 9/1605 700/258 |
| 2016/0144384 | A1* | 5/2016 | Pitz ...................... B41J 11/002 118/323 |
| 2016/0158942 | A1* | 6/2016 | Augenbraun ........ B25J 11/0085 901/10 |
| 2016/0179079 | A1* | 6/2016 | Kram ................... G05B 19/416 700/186 |
| 2017/0266810 | A1 | 9/2017 | Linell et al. |
| 2018/0136623 | A1* | 5/2018 | Mattil ................... B25J 9/1664 |
| 2019/0039243 | A1* | 2/2019 | Takeda ................. B25J 9/1671 |
| 2020/0101610 | A1* | 4/2020 | Thackston ............ B25J 9/1612 |
| 2020/0206919 | A1* | 7/2020 | Nakayama ............ B25J 9/163 |
| 2020/0276708 | A1* | 9/2020 | Shah .................... B25J 19/04 |
| 2020/0306974 | A1* | 10/2020 | Fattey .................. B25J 9/161 |
| 2021/0069900 | A1* | 3/2021 | Wittmann ............. B25J 9/163 |
| 2021/0107157 | A1* | 4/2021 | Bai ...................... B25J 9/1692 |
| 2022/0388171 | A1* | 12/2022 | Kelch ................... B25J 13/085 |
| 2022/0390922 | A1* | 12/2022 | Kelch ................... G06N 5/04 |

OTHER PUBLICATIONS

International Search Report and Written Opinion in International Appln. No. PCT/US2022/031762, dated Aug. 31, 2022, 12 pages.

* cited by examiner

WORKCELL MODELING USING MOTION PROFILE MATCHING AND SWEPT PROFILE MATCHING

BACKGROUND

This specification relates to robotics, and more particularly to automatically generating operating environment models.

In robotics systems, the physical robotic movements to perform tasks are often scheduled by manual pre-programming. For example, a warehouse robot that moves boxes can be programmed to pick up a box at the entrance of a warehouse, move it, and put it down in a target zone of the warehouse. For another example, a construction robot can be programmed to pick up a beam and put it down onto a bridge deck. As each of these actions can include many movements that require high precision, a slight error in the measurement of a robot pose or a pose of a detected object can result in failure of the task. Moreover, errors at an early stage in the process can result in accumulated errors in robotic movements later in the task, further resulting in failed tasks using a pre-programmed schedule.

In general, sophisticated virtual representations of respective robotics systems are helpful for monitoring and improving the respective robotics systems. More specifically, users or engineers operating a robotics system with a virtual representation can be notified with many aspects when operating a robotic system. For example, notifications or information can include a calibration accuracy of each component in the system, whether the current robotics system can perform a task within a tolerance of accuracy, and how each component in the robotics system moves during performing a task, just to name a few examples. The users and engineers can further optimize a physical robotics system by optimizing the corresponding virtual representation before making modifications to the physical robotics systems, which is more efficient and cost-saving than directly modifying the physical robotics system through trial and error.

However, most of the existing robotics systems do not have a corresponding virtual representation. Current techniques in the art do not support automatically generating a corresponding virtual representation of an arbitrarily given robotics system. Moreover, for legacy systems that lack documentation on how each component functions under specific control signals when performing tasks, it is almost impossible to obtain a virtual representation using conventional techniques. Therefore, currently existing robotics systems or legacy systems without corresponding virtual representations cannot make use of benefits such as the efficiency and superior performance provided by using virtual representations.

SUMMARY

This specification describes techniques used to generate a virtual representation of a physical operating environment with multiple calibration entities (e.g., robots, and optionally one or more sensors) that can be calibrated and configured to perform a particular task under respective motions. More specifically, the described techniques relate to generating a virtual representation with one or more respective virtual copies or equivalents (e.g., virtual robot components) of the multiple calibration entities in the physical operating environment, such that the virtual equivalents are configured to have equivalent motions and eventually fulfill equivalent tasks in the virtual representation comparing to those in the physical operating environment.

The term "virtual equivalent" throughout this specification stands for a virtual component in a virtual representation of a physical operating environment equivalent to a particular calibration entity (e.g., a physical robot) in the physical operating environment. The virtual equivalent can have a level of similarity in geometry characteristics with the corresponding calibration entity. The virtual equivalent can have the same movable degrees of freedom as the corresponding calibration entity. In addition, the virtual equivalent can have the same swept volume (e.g., a virtual box in space representing a range of motion) as the corresponding calibration entity.

Alternatively, the virtual equivalent can have different geometry characteristics (e.g., shape or size) from the calibration entity, yet with the same motion characteristics (e.g., degrees of freedom and swept volume), being configured to follow the same trajectory of the calibration entity, and eventually perform the substantially the same task as the calibration entity.

For simplicity, in the following specification, the term "virtual equivalent" is referred to as "virtual robot component," the term "calibration entity" is referred to as "robot." The term "operating environment" is also referred to as "workcell" in the specification below.

A physical workcell to be built can be first virtually planned using conventional techniques. A physical workcell can include multiple robots first designed virtually (e.g., using CAD software), fabricated, and then arranged automatically or by engineers while setting up the operating environment. The multiple robots in the physical workcell can be calibrated and configured to move and perform particular tasks based on a plurality of instructions (e.g., computer programs turning on and off specific control signals.)

However, for situations where it is needed to optimize the performance of one or more robots in the physical workcell, one of ordinary skill in the art can make adjustments for the one or more robots, or replace the one or more robots with different robots directly in the physical workcell by trial and error.

In some embodiments, it may be more efficient to optimize a physical workcell first by generating and optimizing a corresponding virtual representation of the physical workcell, and adopt results obtained from optimizing the virtual representation as guidance for the physical workcell.

However, it is not easy to generate a virtual representation from an existing physical workcell, which requires generating information to represent certain aspects, e.g., geometric characteristics, degrees of motion, and swept volume, of each robot in the physical workcell. In some situations in which the physical workcell is a legacy workcell with no documentation or references regarding how each of the robots would function, it is even more challenging to reverse engineer a virtual representation out of the legacy workcell.

It is also an existing challenge to generate an accurate virtual representation from a physical workcell using reverse engineering. The accuracy varies depending on particular sensors in use, data processing procedure, and algorithms selected for generating a virtual representation.

However, the described techniques in the specification can solve the above-noted problems, the details of which are described below. Particular embodiments of the subject matter described in this specification can be implemented to realize one or more of the following advantages.

The techniques described below can increase efficiency for optimizing a physical workcell. In particular, the described techniques can generate an accurate virtual representation of a physical workcell from sensor data. Therefore, any optimization for the physical workcell can be based on results for optimizing the virtual representation. The optimization of the virtual representation can be implemented using one or more computers located in one or more locations, which can reduce optimization time and improve efficiency.

In addition, the techniques as described can successfully generate a virtual representation of a physical workcell using sensor data. In particular, the techniques can generate a virtual representation of a legacy workcell without documentation, which has been challenging and even impossible for conventional techniques. To generate a virtual representation, the system can first generate motion profiles based on sensor data for each physical robot in the physical workcell, and select corresponding virtual equivalents to the physical robots based on respective motion profiles for generating the virtual representation. The described techniques can further control the selected virtual equivalents to perform tasks equivalent to those of the physical workcell. For example, the described techniques can specify particular motions and poses of virtual equivalents to follow substantially the same trajectories of corresponding physical robots using inverse kinematics.

Moreover, the described techniques are robust and accurate to generate virtual representations of different types of workcells with varying levels of complexity. More specifically, from physical operating environments with merely pneumatic components to those with one or more sophisticated robots with multiple joints, the described techniques can generate an accurate virtual representation using particular algorithms to process collected sensor data, and add one or more virtual robot components (i.e., virtual equivalents) selected from a plurality of virtual robot components to the virtual representation, in which the virtual robot components are configured to perform substantially the same tasks with substantially the same movable degrees of freedom and swept volume as corresponding physical robots in the corresponding physical operating environment.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
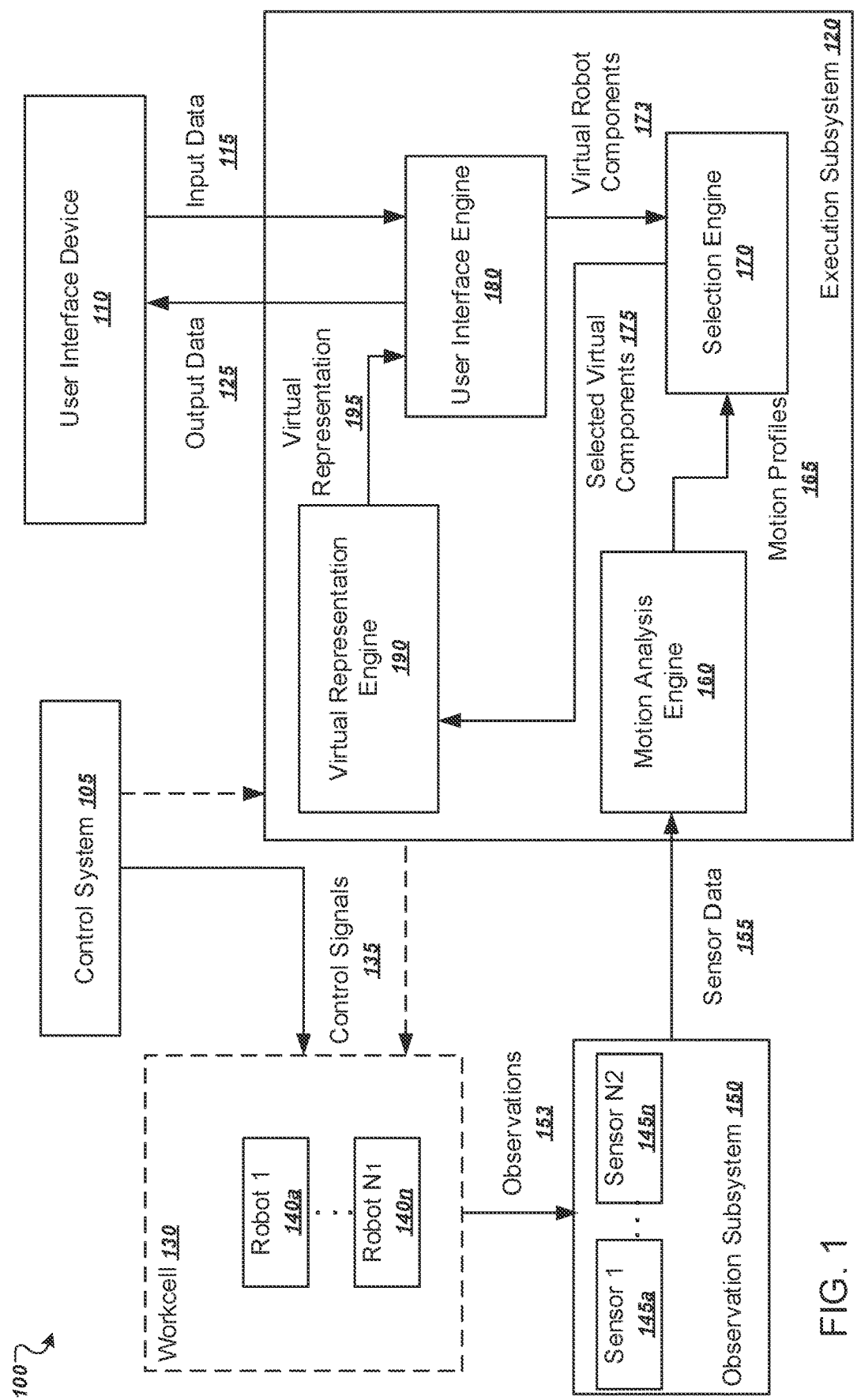
FIG. 1 illustrates an example system to generate a virtual representation with virtual equivalents of a physical workcell.

FIG. 1 illustrates an example system 100 to generate a virtual representation 195 with virtual equivalents of a physical workcell 130 from sensor data.

The example system 100 adopting the described techniques in this specification can include an execution subsystem 120 configured to communicate data with other subsystems of the system 100 to generate a virtual representation of the physical operating environment (e.g., workcell 130). The virtual representation can include one or more virtual equivalents of the physical calibration entities (e.g., robots) of the physical operating environment. The detailed description of the virtual equivalent will be described below.

The execution subsystem 120 can include modules to obtain sensor data from the physical operating environment, and generate motion profiles from the sensor data of one or more physical robots. The execution subsystem 120 can further perform one or more matching processes to match the obtained motion profiles of physical robots each with respective virtual motion profiles prescribed for corresponding virtual components. After performing the matching process, the execution subsystem can then select one or more virtual components as the corresponding virtual equivalents for the physical robots, and build a virtual representation of the physical operating environment using the selected virtual components. The details of generating motion profiles and performing the matching process will be described below.

A virtual representation of a physical workcell can be generally considered as a virtual copy of the physical workcell. More specifically, the virtual representation maps each of the calibration entities (e.g., robots) in the workcell to a respective virtual equivalent, and the spatial configuration of the workcell to a virtual space. As for the spatial configuration of the workcell, the virtual representation can have the same simulated size in space as that for the workcell, and a virtual origin at the same location as that for the origin of the workcell. The virtual representation can also have the same reference coordinate frame setup with respect to the virtual origin as the workcell reference coordinate frame to the workcell origin. For example, the virtual representation and workcell can have respective Cartesian coordinate frames having the same orientation with respect to respective origins.

The system 100 can generate the virtual representation, using one or more computers in one or more locations, based on collected sensor data obtained when monitoring each entity in the workcell, and optionally present the virtual representation on one or more user interfaces (e.g., displays) of the one or more computers. The details of generating the virtual representation using the system 100 will be described below.

The virtual equivalents, as described above, can be considered as virtual robot components in a virtual representation such that the virtual robot components can be configured to serve equivalently to that of a physical robot in the corresponding physical workcell 130. Therefore, the term "virtual equivalent" is also referred to as a virtual robot component in the virtual representation.

The virtual equivalent can have geometric characteristics substantially similar to that of the corresponding physical robot in the workcell. For example, the virtual equivalent can have the same size, shape, and structure as the corresponding robot.

In addition, each of the virtual equivalents can have the same movable degrees of freedom as the robots in the workcell. For example, both the robot and the virtual robot component can translate in a first direction (e.g., DOF 1) and rotate along a first and second axes (e.g., DOFS 4 and 5).

Moreover, each virtual equivalent can share the same range of motion (or swept volume) as a corresponding physical robot. The term "swept volume" throughout the specification stands for a total amount of space or region, within which the corresponding robot or virtual robot component can move. For example, the virtual equivalent and the corresponding robot both can be configured to move within a 500 cm^3 space.

Alternatively, virtual equivalents can have different geometric characteristics from the corresponding robots, as long as each virtual equivalent shares the same degrees of freedom and range of motion as the corresponding robot.

In FIG. 1, as described above, a robot workcell 130 is used as an example of a physical operating environment.

The techniques described in this specification can also be used to generate virtual representations of other operating environments that are not workcells.

The functional components of the system 100 can be implemented as computer programs installed on one or more computers in one or more locations that are coupled to each other through any appropriate communications network, e.g., an intranet or the Internet, or a combination of networks. As shown in FIG. 1, the system 100 can include a user interface device 110, an execution subsystem 120, a control system 105, and an observation subsystem 150.

The system 100 can obtain observations 153 of one or more robots 140 in the workcell 130 using one or more sensors 145 in the observation subsystem 150. The observations 153 can include sensor data 155 representing activities (e.g., motions) of the one or more robots 140 when performing a process or a task in the workcell 130. The activities can include poses of each robot 140 at different time steps, trajectories of each robot when performing the process, and other kinematics associated with each robot 140 (e.g., change position, velocity, and acceleration and a total swept volume). The sensor data 155 can also include geometric characteristics of each robot 140. For example, the geometric characteristics include, for each robot, a general shape and size of each component in the robot, a number of joints, and respective types of all the joints in the robot. In some implementations, the sensor data 155 can further include an origin and coordinate frame for the robot, and a relative position and pose in the reference coordinate frame of the workcell with respect to the workcell origin, to name just a few examples.

The observation subsystem 150 can then provide the sensor data 155 to execution subsystem 120 to generate a corresponding virtual representation of the workcell 130. The details of generating the virtual representation will be described below.

To obtain sensor data 155 representing activities of the one or more robots 140, the control system 105 can issue control signals 135 instructing the one or more robots 140 to perform a process or a task. In some implementations, the control system 105 can first provide the control signals 135 to the execution subsystem 120, which is configured to correlate the control signals for controlling the one or more physical robots 140 and those for controlling virtual equivalents in the corresponding virtual representation 195 of the workcell 130. The execution subsystem 120 can then issue the correlated control signals for controlling the one or more robots 140 in the workcell 130.

Referring to the user interface device 110, users of the system 100 can provide input data 115 representing one or more parameters to the system 100 using the user interface device 110. The one or more parameters can be data defining one or more characteristics for generating a virtual representation. For example, the one or more parameters can be a total number of virtual equivalents to be included when generating a virtual representation, types of virtual equivalents to be included, or values defining a maximum number of virtual equivalents in a virtual representation, or a maximum number of degrees of freedom for a virtual equivalent, to name just a few examples.

Optionally, the input data 115 can include, for example, a user-determined accuracy level for generating a virtual representation from the workcell 130. More specifically, the accuracy level can be a calibration accuracy of the virtual representation, an accuracy tolerance for performing a task using the virtual representation, or a value representing how accurate it is to add to the virtual representation a particular virtual robot component configured to serve as an equivalent to the robot in the workcell.

The user interface device 110 of the system can be any appropriate stationary or mobile computing device, for example, a desktop computer, a workstation in a robot factory, a tablet, a smartphone, or a smartwatch, to name just a few examples.

The user interface device 110 can provide input data 115 to the execution subsystem 120. The user interface device 110 can receive output data 125 from the execution subsystem 120. In some implementations, the output data 125 includes data representing at least one of the following: a virtual representation 195 of the workcell 130 with one or more virtual equivalents; descriptions associated with each of the virtual equivalents, and optionally, alternative virtual robot components can be used to replace the one or more virtual equivalents in the virtual representation. The descriptions associated with each of the virtual equivalents can include data representing movable degrees of freedom and the swept volume of the virtual equivalents. In some implementations, the descriptions can also have a respective price associated with the virtual robot component, a number of actuators and types of each of the number of actuators configured for driving the virtual robot component, and a value representing a level of accuracy of using the virtual robot component in the virtual representation.

The user interface device 110 can then present a representation of the received output data 125. For example, the user interface device 110 can present a graphical user interface with one or more output panes to present a graphical representation of the output data 125. For example, the output panes can include an output pane presenting the virtual representation, with a description page presenting the above-noted descriptions.

The user interface device 110 can also include a portion for users to control the process of generating a virtual representation. The details of the user interface device 110 will be described in connection with FIG. 4.

The execution subsystem 120 of the system 100 includes a virtual representation engine 190, a user interface engine 180, a selection engine 170, and a motion analysis engine 160.

In general, the execution subsystem 120 can receive as input sensor data 155 from the observation subsystem 150, generate a virtual representation 195 with one or more virtual robot components based on the sensor data 155, provide the virtual representation 195 as at least a part of the output data 125 to the user interface device 110, and optionally issue control signals 135 to control operations of the workcell 130.

More specifically, the motion analysis engine 160 can receive the sensor data 155 representing one or more physical robots 140 performing a process or a task in the workcell 130, and can generate respective motion profiles 165 for one or more physical robots. The respective motion profiles each can represent how a physical robot moves while performing the process in the workcell 130. The details of generating motion profiles will be described below in connection with FIG. 3.

The selection engine 170 can receive data representing respective motion profiles 165 from the motion analysis engine 160 and virtual robot components data 173 representing a plurality of candidate virtual robot components that are candidates to be included in a virtual representation of the workcell 130. Each of the plurality of candidate virtual robot components can have a respective associated virtual motion profile. The selection engine 170 can perform a motion profile matching process to determine one or more virtual robot components from the plurality of candidate virtual robot components that match respective motion profiles of respective robots, select the one or more virtual robot components, and add the selected virtual robot components 175 to the virtual representation engine 190. The details of performing the motion profile matching process will be described below in connection with FIG. 3.

The virtual representation engine 190 can generate a virtual representation 195 with the selected virtual components 175. More specifically, the virtual representation engine 190 can generate a virtual representation 195 from the workcell 1300 by, for example, mapping each of the calibration entities in the workcell 130 to respective selected virtual components 175, and generating a spatial configuration of the workcell 130 in a virtual space in which the virtual components 175 are equivalently located and posed, as described above.

The selected virtual components 175 in the virtual representation 195, as described above, can correspond to at least a portion of the robots 140 in the workcell 130. For example, the selected virtual components 175 each corresponds to a different robot of all robots 140 in the workcell 130. The system 100 can, when executing particular instructions, perform substantially the same process or task using the selected virtual components 175 in the virtual representation 195 as that in the workcell 130.

The system 100 can provide the virtual representation 195 to the user interface engine 180. The user interface engine 180 can generate output data 125 based on the virtual representation and present the output data 125 on the user interface device 110.

In some implementations, the input data 115 can include user control data. The user control data can be a request to start generating a virtual representation, a request to pause the generation, or a request to terminate the generation process, to name just a few examples. In some implementations, the user control data can include a user selection of a particular virtual robot component to be included in the virtual representation 195. The user interface engine 180 can identify the user control data from the input data 115 and control the process of generating a virtual representation accordingly.

In some implementations, the execution subsystem system 120 can provide the virtual representation for additional analysis and optimization, within or outside the execution subsystem 120. For example, the execution subsystem 120 can calibrate the generated virtual representation 195 and obtain a particular calibration accuracy. As another example, the execution subsystem 120 can generate control signals 135, based on the virtual representation 195, to control robots 140 in the workcell for calibration or performing a particular task. An example calibration optimization process is described in more detail in common-owned U.S. application Ser. No. 17/089,332, which is incorporated herein by reference.

In some implementations, the virtual representations 165 can alternatively include data representing a virtual copy (i.e., exact copy) of calibration entities in the physical workcell 130 according to digital models, e.g., CAD models, of the entities, observations made by sensors in the workcell 130, or both.

Figure 2:
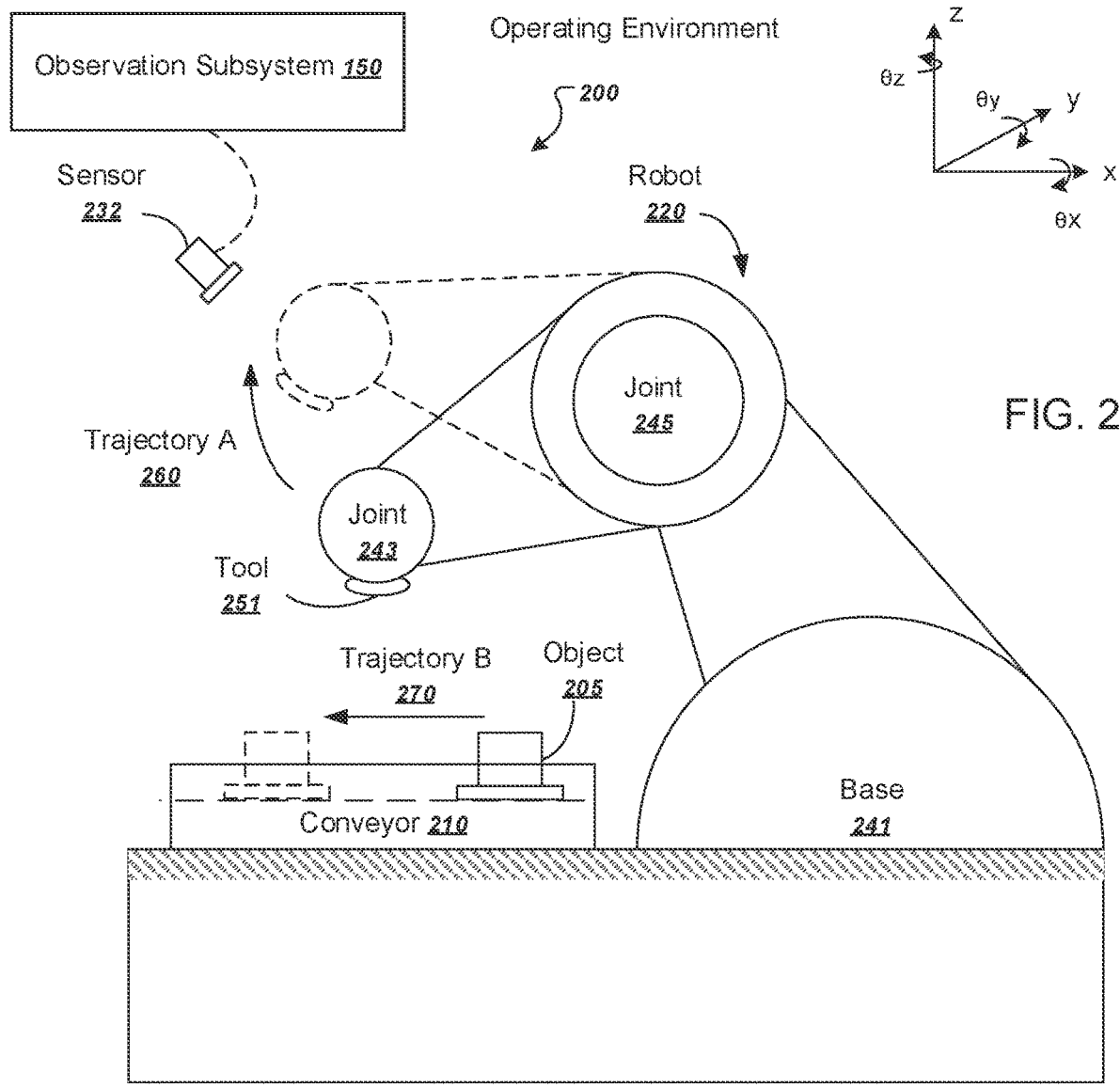
FIG. 2 illustrates an example configuration for collecting data, from an example sensor, to generate motion profiles for an example physical robot and conveyor in a physical workcell.

FIG. 2 illustrates an example configuration for collecting data, from an example sensor 232, to generate motion profiles for an example physical robot 220 and conveyor 210 in a physical workcell 200.

As shown in FIG. 2, the physical workcell 200 includes a robot 220 with a base and multiple joints, in which the base and joints are configured to move in a few degrees of freedom. The physical workcell 200 also includes a conveyor 210 with a top surface configured to transport an object 205 horizontally. The physical workcell 200 further includes a sensor 232 connected to the observation subsystem 150 for observing motions of each physical robots or entities (e.g., the robot 220 and the conveyor 210) in the workcell 130 to generate data based on which the execution subsystem 120 can generate motion profiles.

While FIG. 2 only presents a single robot 220, a single conveyor 210, and a single sensor 200 in the workcell 130 for the ease of illustration, it is noted that the workcell 200 can include any number of these entities, for example, the workcell 200 can include two, five, ten, or more robots, three, seven, or more conveyors, four, six, twelve, or more sensors. Each of the robots in the workcell 200 can have different joints and can be respectively designed. In general, the workcell 200 can include any physical entities with at least one controllable DOF for generating corresponding virtual components in the corresponding virtual representation. In other words, the workcell 200 can also include other types of robots besides the robot 220 and conveyor 210, or other functional components equivalent to the robot 220 or conveyor 210. For example, the robots can be a gantry with two translational DOFS (e.g., along y and z translational directions) and two rotational DOFS (e.g., along θx and θy rotational directions), a hexapod, a delta robot, a scara robot, an articulated robot arm, and a mobile base. The sensors can be any suitable type of sensors for capturing a single image per time or frames of images according to a time sequence per shoot. For example, the sensor 232 can be a laser sensor, or a video camera.

To generate respective motion profiles for each of the physical robot components in the operating environment 200, the sensor 232 can obtain sensor data of the physical robots performing a process in the environment 200.

More specifically, the sensor data for each of the physical robots can include different aspects for describing a physical robot performing a process in the environment 200. For example, the sensor data can include motion data such as positions and poses for each physical robot at one or more time steps. The sensor data can also include geometric characteristics of each robot. For example, the sensor data can be recorded to represent the geometric shape, size, and material of each part of a physical robot. The sensor data can further include respective control signals used to control the robot to perform a respective process in the environment. For example, a physical robot can perform a particular process (e.g., moving an object from point A to point B) under one or more control signals. The sensor data can therefore include the obtained motion data associated with corresponding control signals. This is helpful in particular for legacy operating environments that do not have user manuals specifying the relations between respective control signals and respective processes performed by respective robots controlled by the respective control signals.

In connection with FIG. 2, the sensor 232 can generate sensor data representing a first process performed by the robot 220, and a second process performed by the conveyor 210. For example, the robot 220 can move the joint 243 and the tool 251 from a first initial position to a first target position depicted in dashed lines. As another example, the conveyor 210 can transport an object 205 from a second initial position to a second target position depicted in dashed lines. More specifically, the robot 220 can perform the first process by moving the joint 243 and the tool 251, optionally by also moving the joint 245 and base 241, to the first target position along trajectory A 260. The conveyor 210 can transport the object 205 along the horizontal trajectory B 270 to the second target position. The system 100 can determine the trajectories A 260 and B 270 based on the sensor data collected by the sensor 230 and sent to the observation subsystem 150 by the sensor 230.

The system 100 can obtain motion profiles based on the sensor data for the robot 220 and the conveyor 210. The motion profiles of each physical robot in the workcell 200 can include data representing geometric characteristics of each component of the physical robot, a respective swept volume for the physical robot, and respective movable degrees of freedom of each component of the physical robot.

Respective geometric characteristics represented by a respective motion profile for a respective physical robot can be based on data representing geometric characteristics obtained in the sensor data. The geometric characteristics can be a shape and size of a respective robot, just to name a few examples. In connection with robot 220 and conveyor 210 in FIG. 2, the geometric characteristics of the robot 220 can be the circular shape of joints 243, 245, and base 241, cylindrical shape of respective arms connecting neighbor joints, and respective sizes for the joints, arms, and the tool. The geometric characteristics of the conveyor 210 can be the length of the conveyor 210 and the top surface width of the conveyor 210. Optionally, the system 100 can associate the stiffness of a robot with geometric characteristics and particular types of materials used for each component of the robot.

A respective swept volume represented by a respective motion profile for a respective robot in the operating system can be regarded as a spatial volume encompassing all possible motions performed by the robot. For example, the swept volume can be represented by a three-dimensional box with particular dimensions so that no matter how the motion of each component of a robot is controlled by a particular control signal, each component of the robot will stay within the three-dimensional box. The three dimensional box can be a cubic box at a length of 500 mm or a sphere with a diameter of 1000 mm, just to name a few examples.

Respective movable degrees of freedom represented by a respective motion profile for a respective robot in the operating system can include all movable degrees of each component of the robot. In connection with the robot 220 in FIG. 2, the joints 243, 245 and the tool 251 are movable in translational degrees of freedom x, y, and z, and rotational degrees of freedom θx, θy, and θz. The base 241 of the robot 220 is fixed translationally, but rotatable along the z axis. In connection with the conveyor 210 in FIG. 2, the conveyor can move translationally along the x axis.

The system 100 can determine respective motion profiles and data representing respective geometric characteristics, a respective swept volume, and respective movable degrees of freedom in the respective motions profile based on the collected sensor data using any suitable techniques, for example, calculating trajectories using image analysis algorithms or inverse kinematic algorithms. The system 100 can also determine the respective motion profiles using any suitable machine learning algorithms, e.g., convolutional neural networks.

Figure 3:
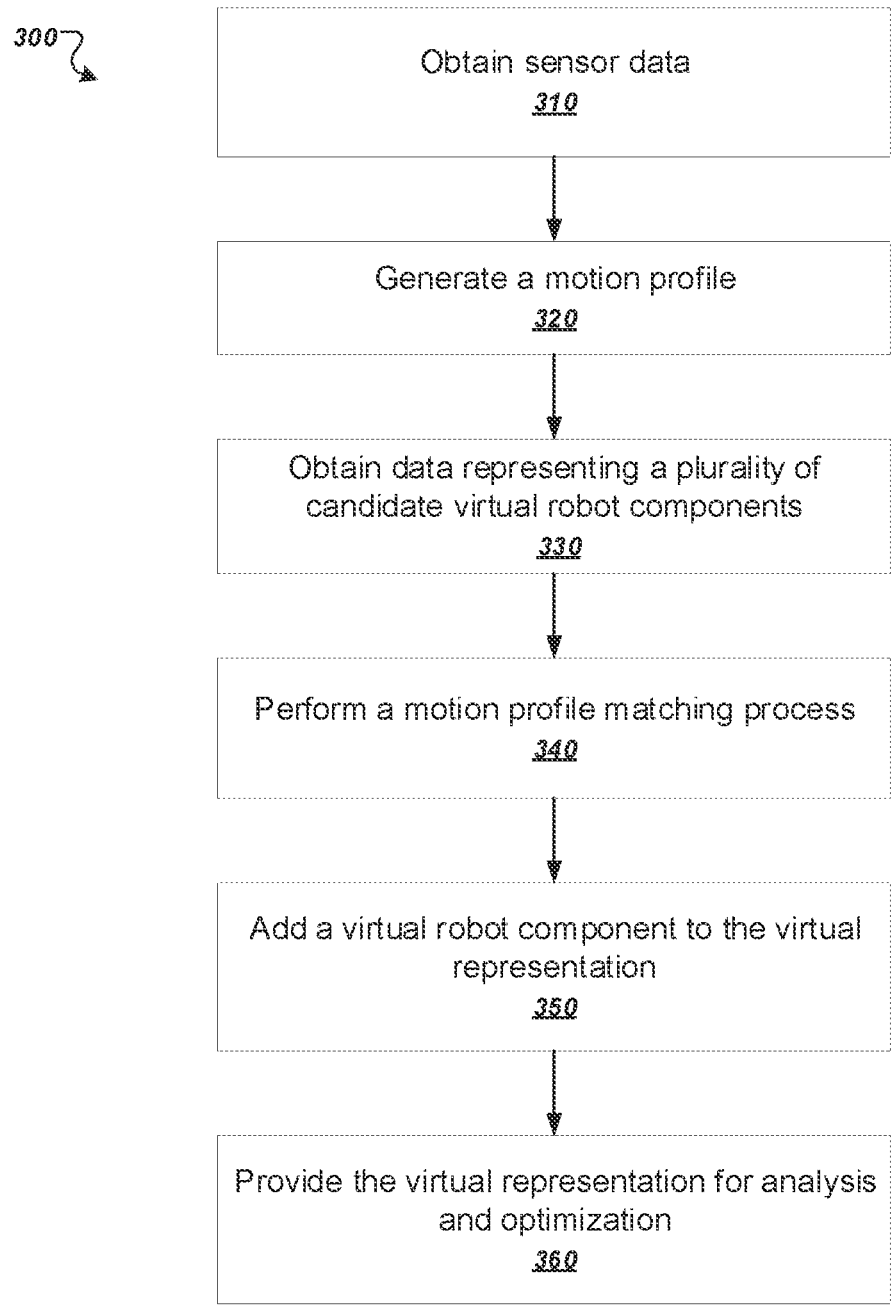
FIG. 3 is a flow diagram of an example process of generating virtual representations with virtual equivalents using the system.

FIG. 3 is a flow diagram of an example process 300 of generating virtual representations with virtual equivalents using the system 100. For convenience, the process 300 will be described as being performed by a system of one or more computers located in one or more locations. For example, a system for measuring and reporting calibration accuracy, e.g., the system 100 of FIG. 1, appropriately programmed, can perform the process 300.

The system 100 obtains sensor data of one or more physical robots performing a process in an operating environment (310). The system 100 can use one or more suitable sensors (e.g., video cameras) to obtain sensor data, including data representing geometric characteristics of respective robots, and motion data representing respective positions and poses of each of the physical robots in a workcell. In connection with FIG. 1, the system 100 can provide the collected sensor data 155 to the execution subsystem 120, in which a motion analysis engine 160 can be configured to obtain one or more motion profiles based on the provided sensor data.

For legacy operating environments lacking manuals describing relations between respective control signals and motions performed by corresponding robots controlled by one or more of the respective control signals, the system 100 can automatically turn on only one or more of the respective control signals according to a predetermined sequence, with the rest of the other control signals being turned off, and collect sensor data representing motions performed by corresponding robots when controlled by the turned-on one or more of the respective control signals. The system 100 can combine the sensor data for a particular robot controlled by corresponding respective control signals to generate a roadmap for controlling different robots using different signals for the legacy operating environment. The system 100 can also use the combined sensor data to generate a virtual representation of the legacy operating environment. The details of generating a virtual representation will be described below.

The system 100 generates, from the sensor data for a first robot of the one or more physical robots, a motion profile representing how the first robot moves while performing the process in the operating environment (320). The sensor data for the first robot can include data monitoring a respective motion of the first robot under a respective control signal of a plurality of control signals configured to control one or more physical robots in the environment. The motion profile, generated based on the sensor data for the first robot and as described above, can include geometric characteristics for the first robot, a respective swept volume for the first robot, and movable degrees of freedom of the first robot.

Optionally, the motion profile can further include data representing a respective trajectory for a respective motion of the first robot when performing a respective process controlled by a particular control signal.

The system 100 can generate the motion profile based on the collected sensor data using any suitable techniques. More specifically, the system 100 can apply any suitable image processing techniques, motion analysis techniques, and any suitable machine learning techniques to generate respective motion profiles using collected sensor data. For example, the system 100 can analyze one or more differences of positions and poses of respective components of a particular robot at different time steps and generate a sequence of change with time in respective positions or poses of the respective components of the particular robot. The system can then obtain motion-related quantities such as velocity, acceleration, trajectory, and swept volume based on the sequence of change. In some implementations, the system 100 can plot positions or poses of a respective component of a physical robot as a discrete function of time steps for determining a respective motion profile. In some implementations, the system 100 can train one or more machine learning models with training samples with associated sensor data and determined motion profile, and perform inference operations for the trained one or more machine learning models to generate a particular motion profile for an input of sensor data observed for a first robot.

In some implementations, the system 100 can generate a respective dynamic function for each robot based on the obtained sensor data, and generate a respective motion profile based on the dynamic function for the robot. The respective dynamic functions can be continuous or discrete with respect to time. The respective dynamic functions can receive as input a current status of the robot (e.g., a current pose, position, velocity, acceleration, and geometric characteristics), control signals (e.g., data representing a to-be-applied force, a to-be-applied momentum, or a change in the force or momentum that could affect a motion of the robot in a future time step), and a time step size. The system 100 can generate a prediction for a pose, position, and trajectory from the current time step to a future time step using the respective dynamic function for a corresponding robot. Optionally, the system 100 does not generate an explicit expression for the dynamic functions, but similar to a black box in which the inherent dynamics for a respective robot are implicitly represented (e.g., any suitable regressions, decision trees, random forests, or machine learning models).

The system 100 can further determine a probability of the robot performing a process following a trajectory based on the determined dynamics function generated by the obtained sensor data. For example, the system 100 can determine whether a robot would follow the trajectory prescribed by the dynamics function at a chance of 90%, 95%, or 99%.

Optionally, one or more sensors of the system 100 can collect sensor data for at least a portion of all robots in an operating environment. The system 100 can therefore isolate sensor data for each of the portion of robots by various methods. For example, the system can apply any suitable image process algorithms to isolate sensor data for a particular robot among a plurality of robots in the sensor data obtained by one or more sensors. For example, the system can determine a graphical distance between different robots captured in one or more image frames to isolate each robot and its associated geometric characteristics and motion data. As another example, the system can apply any suitable machine learning algorithms (e.g., clustering algorithms such as K-means algorithm or image detection techniques based on trained neural networks) to identify and isolate each robot from one or more robots captured in the sensor data.

The system 100 obtains data representing a plurality of candidate virtual robot components (e.g., virtual equivalents of the physical robots) that are candidates to be included in a virtual representation of the operating environment, in which each candidate virtual robot component has a respective associated virtual motion profile (330). In general, a virtual motion profile can be regarded as a virtual version of a physical motion profile, as described above. More specifically, the system 100 can obtain data from internal or external memory specifying a plurality of virtual robot components. Each of the plurality virtual components can have a respective structure with respective geometric characteristics (e.g., a respective shape and size), a respective virtual motion profile including data representing a respective virtual swept volume, and movable degrees of freedom.

The system 100 performs a motion profile matching process to determine a first virtual robot component from the plurality of candidate virtual robot components that matches the first robot (340). More specifically, the system can select, as the first virtual robot, one candidate virtual robot from the plurality of candidate virtual robot components each having a respective virtual motion profile with equivalent geometric characteristics, swept volume, and movable degrees of freedom represented by the data of the motion profile for the corresponding physical robot. The selected virtual robot, also referred to as the virtual equivalent of the physical robot, can have a substantially similar motion profile to the physical counterpart (e.g., same movable degrees of freedom and swept volume), even if when having different geometric characteristics (e.g., different size and shape for each component, different number of joints).

The system 100 can determine one or more virtual actuators and respective controls of each of the one or more virtual actuators for the selected virtual robot, so that the selected virtual robot can perform substantially the same process as the corresponding physical robot following a respective trajectory. Optionally, the respective trajectory for the virtual equivalent can be substantially the same as that of the physical counterpart. To determine, the system 100 can use inverse kinematics algorithms to determine respective forces or momentums needed to apply to respective joints of the virtual robot component, respective changes in forces and momentums, or respective timings of applying or changing the forces and momentums for the virtual robot component so that the virtual robot component can perform substantially the same process as the physical robot, and optionally travel long a virtual trajectory equivalent to the trajectory of the physical counterpart.

The system 100 can select the virtual robot from a plurality of virtual robots using various methods. For example, the system 100 can generate a motion profile matching score for each virtual robot and select the virtual robot based on the respect motion profile matching scores.

More specifically, for each of the plurality of candidate virtual robots, the system 100 can generate a respective motion profile matching score based at least on a respective difference between a physical motion profile of a physical robot and respective virtual motion profiles of respective virtual robot components. The matching score can increase with the difference decreasing. The difference can include a level of difference between the geometric characteristics, the movable degrees of freedom, and the swept volume for the physical and each of the respective virtual motion profiles. The level of difference can be represented by any suitable manner, e.g., an absolute scalar value, a mean square root value, or a numeral vector representing a level of difference in a feature space.

The system 100 can select, as the virtual robot, one candidate virtual robot from the plurality of candidate virtual robots based at least on the respective motion profile matching scores. For example, the system 100 can select one candidate virtual robot as the virtual robot with a maximum motion profile matching score. As another example, the system 100 can select one candidate virtual robot as the virtual robot with a top-three matching score and having the lowest cost.

Alternatively, the system 100 can select the virtual robot based on an output prediction from a trained machine learning model. More specifically, the system 100 can obtain data representing a trained machine learning model configured to perform inference computations for the motion profile as input. Optionally, the system 100 can first train a particular machine learning model for selecting the virtual robot using particular training examples.

The system 100 can generate a prediction of the virtual robot from the plurality of candidate virtual robots to be selected as an output for performing inference computations using the trained machine learning model. The system 100 can choose, as the virtual robot, one candidate virtual robot from the plurality of candidate virtual robots based at least on the prediction. For example, the system 100 can select one candidate virtual robot as the virtual robot with the highest probability of being the virtual robot. As another example, the system 100 can choose as the virtual robot, one candidate virtual robot with a top-three probability and the most straightforward design.

Optionally, the system 100 can generate a virtual robot based on a trained machine learning model. More specifically, the system can predict a required virtual motion profile based on the physical motion profile of the physical robot, in which the required virtual motion profile includes data representing geometric characteristics of the virtual robot, a swept volume, movable degrees of freedom, number of joints, types of each joint, and forces and momentums to be applied to each joint to have the virtual robot to perform substantially the same process as the physical counterpart under one or more particular control signals.

The system adds the first virtual robot component to the virtual representation of the operating environment (350). More specifically, the system can generate an overall virtual representation of a physical workcell first, and add corresponding virtual equivalents of the physical robots into the overall virtual representation to generate an output virtual representation of the physical workcell.

Optionally, the system can provide data representing the virtual representation with the first virtual robot component for additional analysis or optimization (360). The system 100 can provide the virtual representation to a host, a server, or a processor, located remotely or in the same location. The host can further analyze if the virtual representation and the current physical workcell perform one or more tasks efficiently and accurately. The host can accordingly optimize the virtual representation by further calibrating the virtual representation or replacing one or more virtual robots with other virtual ones. The system 100 can utilize the optimization result of the virtual representation as guidance when optimizing the physical workcell.

Figure 4:
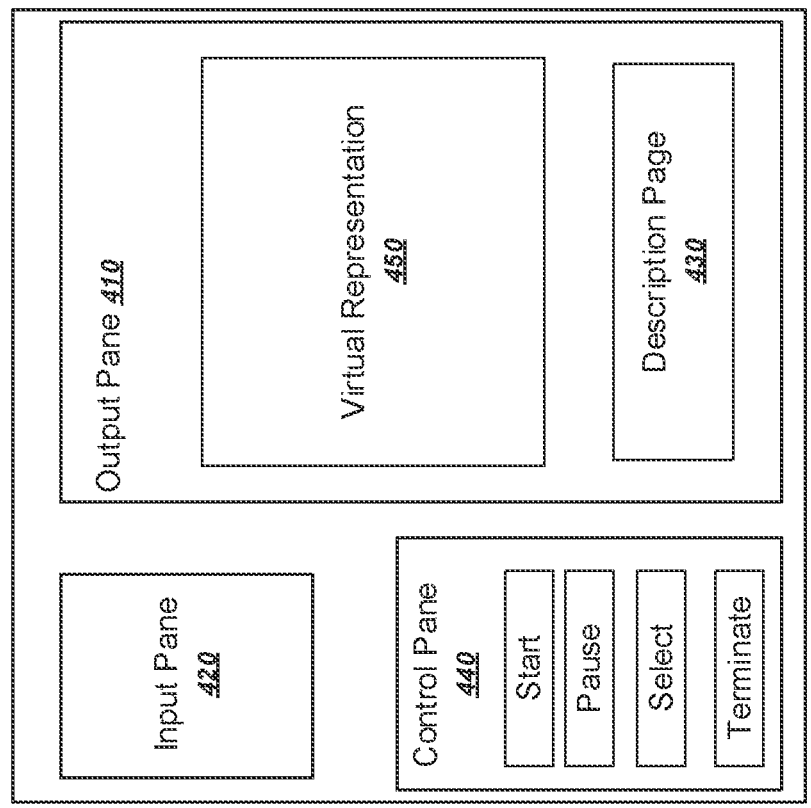
FIG. 4 illustrates an example user interface presentation.

FIG. 4 illustrates an example user interface presentation 400.

As shown in FIG. 4, the user interface presentation 400 can include multiple panes. For example, the user interface presentation 400 can include an input pane 420 and an output pane 410. The output pane 410 can include a representation pane 440 for a virtual representation and a description pane 430 for presenting descriptive information relating to the virtual representation.

Optionally, the user interface presentation 400 can further include a control pane 440. The control pane 440 can include multiple buttons configured to control the process of generating a virtual representation using the system 100. A user of the system 100 can control the process by selecting one or more of the multiple buttons in the control pane 440. The control pane 440 can include buttons such as "start" to initiate the process of generating a virtual representation for a given physical operating environment, "pause" to halt the process, "terminate" to quit the process, and "select" to choose one virtual robot component for overriding the virtual robot selected automatically by the system 100.

A user of the system can provide data to a user interface device of the system 100 through the input pane 420 on the user interface presentation 400. More specifically, the data input to the input pane 420 can include a user-defined number of virtual robots for generating a virtual representation, user-specified type of virtual robots, motion limitations and requirements for each of the prescribed virtual robots, and cost and design for each of the prescribed virtual robots.

After the system has generated a virtual representation of a physical work cell, the system 100 can provide the virtual representation on the virtual representation pane 450. In this pane, the system can demonstrate how each virtual robot functions and how the virtual representation performs one or more tasks under respective prescribed control signals. The user can also be notified on the virtual representation pane 450 a level of accuracy for the virtual representation to perform a particular task, a possibility of a particular virtual robot to replace the physical robot, and one or more other virtual robots as alternatives for a current virtual robot in the virtual representation. A user of the system 100 can select one or more virtual robots in the virtual representation. The system 100 can provide detailed information of the selected virtual robots on the description page 430. The user can be notified by the detailed description such as design, cost, and virtual motion profile of the selected virtual robot on the description page 430, just to name a few examples.

Optionally, the user can replace one or more of the virtual robots in the virtual representation by selecting "select" in the control pane 440 to choose one of the alternative virtual robots for the replacement.

In this specification, a robot is a machine having a base position, one or more movable components, and a kinematic model that can be used to map desired positions, poses, or both in one coordinate system, e.g., Cartesian coordinates or joint angles, into commands for physically moving the one or more movable components to the desired positions or poses. In this specification, a tool is a device that is part of and is attached at the end of the kinematic chain of the one or more moveable components of the robot. Example tools include grippers, welding devices, and sanding devices.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, e.g., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program which may also be referred to or described as a program, software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

For a system of one or more computers to be configured to perform particular operations or actions means that the system has installed on it, software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g., a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

In addition to the embodiments described above, the following embodiments are also innovative:

Embodiment 1 is a method comprising:
obtaining sensor data of one or more physical robots performing a process in an operating environment;
generating, from the sensor data for a first robot of the one or more physical robots, a motion profile representing how the first robot moves while performing the process in the operating environment;
obtaining data representing a plurality of candidate virtual robot components that are candidates to be included in a virtual representation of the operating environment, wherein each candidate virtual robot component has a respective associated virtual motion profile;
performing a motion profile matching process to determine a first virtual robot component from the plurality of candidate virtual robot components that matches the first robot; and
adding the first virtual robot component to the virtual representation of the operating environment.

Embodiment 2 is the method of embodiment 1, wherein the sensor data for the first robot comprises: for each of a plurality of control signals configured to control at least the first robot of the one or more physical robots, respective sensor data monitoring a respective motion of the first robot under the control signal.

Embodiment 3 is the method of embodiment 1 or 2, wherein the motion profile representing how the first robot moves comprises data representing geometric characteristics, a swept volume, and movable degrees of freedom of the first robot.

Embodiment 4 is the method of embodiment 3, wherein performing the motion profile matching process to determine the first virtual robot component that matches the first robot, comprises:
selecting, as the first virtual robot component, one candidate virtual robot component from the plurality of candidate virtual robot components that having a respective virtual motion profile with equivalent geometric characteristics, swept volume, and movable degrees of freedom represented by the data of the motion profile.

Embodiment 5 is the method of any one of embodiments 1-4, wherein the motion profile further comprises data representing a trajectory of the motion of the first robot under a particular control signal, the method further comprising:
determining one or more virtual actuators and controls of each of the one or more virtual actuators for the first virtual robot using inverse kinematics algorithm so that the first virtual robot component is configured to travel long a virtual trajectory equivalent to the trajectory.

Embodiment 6 is the method of embodiment 4, wherein selecting one candidate virtual robot component as the first virtual robot component, further comprises:
obtaining data representing a trained machine learning model configured to perform inference computations for the motion profile as input;
generating a prediction of the first virtual robot component from the plurality of candidate virtual robot components as an output for performing inference computations using the trained machine learning model; and
selecting, as the first virtual robot component, one candidate virtual robot component from the plurality of candidate virtual robot components based at least on the prediction.

Embodiment 7 is the method of embodiment 4, wherein selecting one candidate virtual robot component as the first virtual robot component, further comprises:
for each of the plurality of candidate virtual robot components, generating a respective motion profile matching score based at least on a respective difference between the geometric characteristics, the movable degrees of freedom, and the swept volume for the first robot and those for the candidate virtual robot components; and
selecting, as the first virtual robot component, one candidate virtual robot component from the plurality of candidate virtual robot components based at least on the respective motion profile matching scores.

Embodiment 8 is the method of any one of embodiments 1-7, wherein generating the motion profile comprises:
generating a dynamic function from the obtained sensor data for the first robot; and
generating the motion profile based on the dynamic function.

Embodiment 9 is the method of any one of embodiments 1-8, further comprising:
providing data representing the virtual representation with the first virtual robot component for additional analysis or optimization.

Embodiment 10 is a system comprising one or more computers and one or more storage devices storing instructions that are operable, when executed by the one or more computers, to cause the one or more computers to perform the method of any one of embodiments 1 to 9.

Embodiment 11 is a computer storage medium encoded with a computer program, the program comprising instructions that are operable, when executed by data processing apparatus, to cause the data processing apparatus to perform the method of any one of embodiments 1 to 9.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain some cases, multitasking and parallel processing may be advantageous.

What is claimed is:

1. A computer-implemented method comprising:
obtaining sensor data of one or more physical robots performing a process in an operating environment;
generating, from the sensor data for a first robot of the one or more physical robots, a motion profile representing how the first robot moves while performing the process in the operating environment;
obtaining data representing a plurality of candidate virtual robot components that are candidates to be included in a virtual representation of the operating environment, wherein each candidate virtual robot component has a respective associated virtual motion profile;
performing a motion profile matching process to determine a first virtual robot component from the plurality of candidate virtual robot components that matches the first robot using the motion profile and the respective associated virtual motion profiles for the plurality of candidate virtual robot components, comprising:
selecting, using the respective associated virtual motion profiles, the first virtual robot component, wherein the first virtual robot component has a respective associated virtual motion profile with equivalent geometric characteristics, swept volume, or movable degrees of freedom represented by the data of the motion profile; and
adding the first virtual robot component to the virtual representation of the operating environment.

2. The computer-implemented method of claim 1, wherein the sensor data for the first robot comprises: for each of a plurality of control signals configured to control at least the first robot of the one or more physical robots, respective sensor data monitoring a respective motion of the first robot under the control signal.

3. The computer-implemented method of claim 1, wherein the motion profile representing how the first robot moves comprises data representing geometric characteristics, a swept volume, and movable degrees of freedom of the first robot.

4. The computer-implemented method of claim 3, wherein performing the motion profile matching process to determine the first virtual robot component that matches the first robot, comprises:
selecting, as the first virtual robot component, one candidate virtual robot component from the plurality of candidate virtual robot components that has a respective virtual motion profile with equivalent geometric characteristics, swept volume, and movable degrees of freedom represented by the data of the motion profile.

5. The computer-implemented method of claim 1, wherein the motion profile further comprises data representing a trajectory of the motion of the first robot under a particular control signal, the method further comprising:
determining one or more virtual actuators and controls of each of the one or more virtual actuators for the first virtual robot using an inverse kinematics algorithm so that the first virtual robot component is configured to travel along a virtual trajectory equivalent to the trajectory.

6. The computer-implemented method of claim 4, wherein selecting one candidate virtual robot component as the first virtual robot component, further comprises:
obtaining data representing a trained machine learning model configured to perform inference computations for the motion profile as input;
generating a prediction of the first virtual robot component from the plurality of candidate virtual robot components as an output for performing inference computations using the trained machine learning model; and
selecting, as the first virtual robot component, one candidate virtual robot component from the plurality of candidate virtual robot components based at least on the prediction.

7. The computer-implemented method of claim 4, wherein selecting one candidate virtual robot component as the first virtual robot component, further comprises:
for each of the plurality of candidate virtual robot components, generating a respective motion profile matching score based at least on a respective difference between the geometric characteristics, the movable degrees of freedom, and the swept volume for the first robot and those for the candidate virtual robot components; and
selecting, as the first virtual robot component, one candidate virtual robot component from the plurality of candidate virtual robot components based at least on the respective motion profile matching scores.

8. The computer-implemented method of claim 1, wherein generating the motion profile comprises:
generating a dynamic function from the obtained sensor data for the first robot; and
generating the motion profile based on the dynamic function.

9. The computer-implemented method of claim 1, further comprising:
providing data representing the virtual representation with the first virtual robot component for additional analysis or optimization.

10. A system comprising one or more computers and one or more storage devices storing instructions that when executed by one or more computers cause the one or more computers to perform respective operations, the operations comprising:
obtaining sensor data of one or more physical robots performing a process in an operating environment;
generating, from the sensor data for a first robot of the one or more physical robots, a motion profile representing how the first robot moves while performing the process in the operating environment;
obtaining data representing a plurality of candidate virtual robot components that are candidates to be included in a virtual representation of the operating environment, wherein each candidate virtual robot component has a respective associated virtual motion profile;
performing a motion profile matching process to determine a first virtual robot component from the plurality of candidate virtual robot components that matches the first robot using the motion profile and the respective associated virtual motion profiles for the plurality of candidate virtual robot components, comprising:
  selecting, using the respective associated virtual motion profiles, the first virtual robot component, wherein the first virtual robot component has a respective associated virtual motion profile with equivalent geometric characteristics, swept volume, or movable degrees of freedom represented by the data of the motion profile; and
  adding the first virtual robot component to the virtual representation of the operating environment.

11. The system of claim 10, wherein the motion profile representing how the first robot moves comprises data representing geometric characteristics, a swept volume, and movable degrees of freedom of the first robot.

12. The system of claim 11, wherein performing the motion profile matching process to determine the first virtual robot component that matches the first robot, comprises:
  selecting, as the first virtual robot component, one candidate virtual robot component from the plurality of candidate virtual robot components that has a respective virtual motion profile with equivalent geometric characteristics, swept volume, and movable degrees of freedom represented by the data of the motion profile.

13. The system of claim 10, wherein the motion profile further comprises data representing a trajectory of the motion of the first robot under a particular control signal, the operations further comprising:
  determining one or more virtual actuators and controls of each of the one or more virtual actuators for the first virtual robot component using an inverse kinematics algorithm so that the first virtual robot component is configured to travel along a virtual trajectory equivalent to the trajectory.

14. The system of claim 12, wherein selecting one candidate virtual robot component as the first virtual robot component, further comprises:
  obtaining data representing a trained machine learning model configured to perform inference computations for the motion profile as input;
  generating a prediction of the first virtual robot component from the plurality of candidate virtual robot components as an output for performing inference computations using the trained machine learning model; and
  selecting, as the first virtual robot component, one candidate virtual robot component from the plurality of candidate virtual robot components based at least on the prediction.

15. The system of claim 12, wherein selecting one candidate virtual robot component as the first virtual robot component, further comprises:
  for each of the plurality of candidate virtual robot components, generating a respective motion profile matching score based at least on a respective difference between the geometric characteristics, the movable degrees of freedom, and the swept volume for the first robot and those for the candidate virtual robot components; and
  selecting, as the first virtual robot component, one candidate virtual robot component from the plurality of candidate virtual robot components based at least on the respective motion profile matching scores.

16. One or more non-transitory computer-readable storage media storing instructions that when executed by one or more computers cause the one or more computers to perform respective operations, the respective operations comprising:
  obtaining sensor data of one or more physical robots performing a process in an operating environment;
  generating, from the sensor data for a first robot of the one or more physical robots, a motion profile representing how the first robot moves while performing the process in the operating environment;
  obtaining data representing a plurality of candidate virtual robot components that are candidates to be included in a virtual representation of the operating environment, wherein each candidate virtual robot component has a respective associated virtual motion profile;
  performing a motion profile matching process to determine a first virtual robot component from the plurality of candidate virtual robot components that matches the first robot using the motion profile and the respective associated virtual motion profiles for the plurality of candidate virtual robot components, comprising:
    selecting, using the respective associated virtual motion profiles, the first virtual robot component, wherein the first virtual robot component has a respective associated virtual motion profile with equivalent geometric characteristics, swept volume, or movable degrees of freedom represented by the data of the motion profile; and
  adding the first virtual robot component to the virtual representation of the operating environment.

17. The one or more non-transitory computer-readable storage media of claim 16, wherein the motion profile representing how the first robot moves comprises data representing geometric characteristics, a swept volume, and movable degrees of freedom of the first robot.

18. The one or more non-transitory computer-readable storage media of claim 17, wherein performing the motion profile matching process to determine the first virtual robot component that matches the first robot, comprises:
  selecting, as the first virtual robot component, one candidate virtual robot component from the plurality of candidate virtual robot components that has a respective virtual motion profile with equivalent geometric characteristics, swept volume, and movable degrees of freedom represented by the data of the motion profile.

19. The one or more non-transitory computer-readable storage media of claim 18, wherein selecting one candidate virtual robot component as the first virtual robot component, further comprises:
  obtaining data representing a trained machine learning model configured to perform inference computations for the motion profile as input;
  generating a prediction of the first virtual robot component from the plurality of candidate virtual robot components as an output for performing inference computations using the trained machine learning model; and
  selecting, as the first virtual robot component, one candidate virtual robot component from the plurality of candidate virtual robot components based at least on the prediction.

20. The one or more non-transitory computer-readable storage media of claim 18, wherein selecting one candidate virtual robot component as the first virtual robot component, further comprises:
  for each of the plurality of candidate virtual robot components, generating a respective motion profile matching score based at least on a respective difference between the geometric characteristics, the movable degrees of freedom, and the swept volume for the first robot and those for the candidate virtual robot components; and selecting, as the first virtual robot component, one candidate virtual robot component from the plurality of candidate virtual robot components based at least on the respective motion profile matching scores.

\* \* \* \* \*